United States Patent
Chung

(10) Patent No.: US 7,355,475 B2
(45) Date of Patent: Apr. 8, 2008

(54) OUTPUT CIRCUIT OF VACUUM-TUBE AMPLIFIER

(75) Inventor: Soung Whan Chung, Jeonbuk (KR)

(73) Assignee: AVERD Labs Co., Ltd., Goyang-si, Gyeonggi-do ( * ) Notice: Subject to any disclaimer, the term of this patent is extended or adjusted under 35 U.S.C. 154(b) by 0 days.

(21) Appl. No.: 11/464,783

(22) Filed: Aug. 15, 2006

(65) Prior Publication Data
US 2008/0042744 A1 Feb. 21, 2008

(51) Int. Cl.
*H03F 1/00* (2006.01)
(52) U.S. Cl. .......................... 330/192; 330/49
(58) Field of Classification Search ............... 330/192, 330/41, 42, 43, 44, 49, 64, 70
See application file for complete search history.

(56) References Cited

U.S. PATENT DOCUMENTS

| | | | | |
|---|---|---|---|---|
| 3,453,555 A | * | 7/1969 | Bacon | 330/46 |
| 4,924,191 A | * | 5/1990 | Erb et al. | 330/130 |
| 5,422,599 A | * | 6/1995 | Larsen | 330/196 |
| 6,737,915 B1 | * | 5/2004 | Harner | 330/3 |
| 7,145,392 B2 | * | 12/2006 | Peavey et al. | 330/262 |

* cited by examiner

*Primary Examiner*—Henry Choe
(74) *Attorney, Agent, or Firm*—JHK Law; Joseph Hyosuk Kim

(57) ABSTRACT

An output circuit of a vacuum-tube amplifier is disclosed. An output circuit of a conventional vacuum-tube amplifier has shortcomings that a front end amplification unit uses a coupling condenser or a transformer to output an AC signal to an output node, a bias voltage of a cathode of a vacuum tube is varied in response to an input signal in an output buffer and, when the bias voltage is higher than a voltage set by a bias resistor, signal attenuation by the difference between the bias voltage and the set voltage is generated. To solve these shortcomings, the output circuit of the vacuum-tube amplifier includes a front end amplification unit for amplifying an input signal using a vacuum tube and an output amplification unit for power-amplifying the output signal of the front end amplification unit using a vacuum tube. The output circuit of the vacuum-tube amplifier further includes a zero voltage-maintaining circuit for detecting a voltage of a cathode of the vacuum tube of the front end amplification unit and controlling a voltage applied to a plate of the vacuum tube to maintain the DC voltage of the cathode as 0V, and a variable self-bias circuit for maintaining a bias voltage of a cathode of the vacuum tube of the output amplification unit uniform irrespective of a variation in the input signal.

4 Claims, 5 Drawing Sheets

"Prior Art"

"Prior Art"

OUTPUT CIRCUIT OF VACUUM-TUBE AMPLIFIER

BACKGROUND OF THE INVENTION

1. Field of the Invention

The present invention relates to an output circuit of a vacuum-tube amplifier, and more particularly, to an output circuit of a vacuum-tube amplifier, which maintains a voltage between a ground terminal and an output terminal of the vacuum-tube amplifier as 0V to output an amplified signal without using a coupling condenser or a transformer and maintains a voltage of a cathode of a vacuum tube of an output stage uniform by a variable self-bias circuit to obtain linearity of output power in proportion to an increase in an input signal without being affected by the cathode when the input signal is increased, increase the output power and improve distortion.

2. Background of the Related Art

In spite of advantages of a semiconductor device, lovers of music still prefer an audio amplifier using a vacuum tube because the audio amplifier using a vacuum tube has sound quality higher than that of a semiconductor amplifier.

FIG. 1 is a circuit diagram of an output circuit of a conventional vacuum-tube amplifier. Referring to FIG. 1, the output circuit of the vacuum-tube amplifier includes an amplification unit and an output buffer unit. The amplification unit receives an input signal through a grid G of a vacuum tube 1, receives a voltage V1 through a plate P of the vacuum tube 1, amplifies the input signal, and outputs the amplified signal through a cathode K of the vacuum tube 1. A coupling condenser C1 and a bias resistor R1 are connected to the cathode K of the vacuum tube 1 such that the amplified signal is output to an output node N1 through the coupling condenser C1.

In case of a multi-stage amplifier, multiple vacuum tubes having the same configuration as the vacuum tube 1 are connected in parallel, a bias resistor and a coupling condenser are connected to the cathode of each of the multiple vacuum tubes, and output nodes are commonly connected in parallel. FIG. 1 illustrates only one vacuum tube.

The output buffer unit receives the signal of the output node N1 of the amplification unit through a grid G1 of a vacuum tube 2 and outputs the amplified signal to a speaker 4 through a plate P1 of the vacuum tube 2. A resistor R2 and an AC bypass condenser C2 are connected in parallel with a cathode K1 of the vacuum tube 2 to construct a self-bias circuit 5.

To output a signal amplified by the vacuum tube 1 in the amplification unit, the coupling condenser C1 or a transformer for cutting off a DC voltage must be used at the cathode K of the vacuum tube 1. A general method sets the resistance of the resistor R1 such that a voltage, obtained by halving the plate voltage V1 of the vacuum tube 1, is set to the cathode K of the vacuum tube 1. That is, when the amplification unit is directly connected to a following amplifier, the coupling condenser C1 or a transformer must be used in order to cut off a DC signal and pass only an AC signal because there is a DC components in a signal transmitted to the following amplifier.

The output buffer unit connects the resistor R2 of hundreds to thousands ohm to the cathode K1 of the vacuum tube 2. A bias voltage is applied to the vacuum tube 2 using a voltage drop according to the resistance R2. That is, a self-bias method is used in the output buffer unit.

FIG. 2 illustrates cathode and output power characteristics with respect to an input signal of a self-bias amplification circuit. In the self-bias circuit as illustrated in FIG. 1, when the voltage applied to the grid G1 is increased, current of the cathode K1 is increased in proportion to the increase in the voltage applied to the grid G1. Here, the voltage is increased in proportion to the current by resistance set to the cathode K1. A voltage according to a basic current value of the cathode K1 and the input signal of the grid G1 are increased in proportion to the input signal voltage in a satisfactory manner in response to the amplification factor of the vacuum tube 2. When an input signal having a voltage exceeding the voltage according to the basic current value of the cathode K1 and the input signal voltage of the grid G1 is applied, however, an increase in the voltage of the cathode K1 attenuates the input voltage of the grid G1 by the increase in the voltage of the cathode K1. Accordingly, the input signal and output power do not achieve satisfactory linearity, as illustrated in FIG. 2.

SUMMARY OF THE INVENTION

Accordingly, the present invention has been made to solve the above-mentioned problems occurring in the prior art, and it is an object of the present invention to provide an output circuit of a vacuum-tube amplifier, which employs a zero voltage-maintaining circuit that maintains an output terminal of a front end amplifier as 0V to transmit a signal without using a coupling condenser or a transformer for cutting off a DC voltage at an output node of the front end amplifier.

Another object of the present invention is to provide a variable self-bias circuit of a vacuum-tube amplifier, which prevents a voltage set to a cathode of a vacuum tube from being varied irrespective of the power level of an input signal applied to a grid in an output amplification stage of the vacuum-tube amplifier.

To accomplish the above objects, according to the present invention, there is provided an output circuit of a vacuum-tube amplifier including: a front end amplification unit for amplifying an input signal using a first vacuum tube; an output amplification unit for power-amplifying the output signal of the front end amplification unit using a second vacuum tube and outputting the amplified signal to the outside; a zero voltage-maintaining circuit for controlling a voltage applied to a plate of the first vacuum tube in response to the voltage of a cathode of the first vacuum tube to maintain the DC voltage of the cathode of the first vacuum tube as 0V; and a variable self-bias circuit for maintaining a bias voltage of a cathode of the second vacuum tube uniform irrespective of a variation in the input signal.

The front end amplification unit includes: the first vacuum tube having a grid connected to a signal input port and a cathode connected to an output node; a resistor R11 for applying a negative voltage V3 to the cathode of the first vacuum tube; a resistor R12 for applying a positive voltage V1 to the plate of the first vacuum tube; the zero voltage-maintaining circuit continuously controlling connection/short-circuiting of a resistor R17 for dividing the positive voltage V1 with the resistor R12 in response to a predetermined time constant based on the voltage of the cathode of the first vacuum tube and maintaining the DC voltage of the cathode of the first vacuum tube as 0V according to the control of the positive voltage V1; and a first smoothing condenser connected between the plate of the first vacuum tube and a ground terminal and a second smoothing condenser connected between the ground terminal and the terminal of the negative voltage V3.

The zero voltage-maintaining circuit includes: the voltage-dividing resistor R17 connected to the plate of the first vacuum tube; a power amplifier connected to the output terminal (−) of the voltage-dividing resistor R17; and a differential amplifier having a non-inverted input terminal (+) receiving the voltage of the cathode of the first vacuum tube through voltage-dividing resistors R13 and R17 and a time constant condenser C13 and an inverted input terminal receiving the voltage of an output terminal of the differential amplifier through voltage-dividing resistors R14 and R15 and a time constant condenser C14, the output terminal of the differential amplifier being connected to an output terminal (+) of the power amplifier.

The variable self-bias circuit of the output amplification unit includes: a differential amplifier having a non-inverted input terminal (+) receiving the output voltage of the cathode of the second vacuum tube, which is divided by two resistors, and an inverted input terminal (−) receiving a reference voltage set by a zener diode; a power amplifier having an input terminal (+) connected to the an output terminal of the differential amplifier and an output terminal (−) connected to the cathode of the second vacuum tube through a resistor R23; and a smoothing condenser connected between the cathode of the second vacuum tube and the ground terminal to smooth a peak value.

While the zero voltage-maintaining circuit is used in a circuit in which the front end amplification unit and the output amplification unit are connected in the present invention, the zero voltage-maintaining circuit can be used in any amplifier circuit using a vacuum tube, which requires an AC coupling condenser or a transformer at an output stage, to output an AC signal without using the coupling condenser or the transformer.

The variable self-bias circuit is applied to the output circuit of any power amplifier circuit using a vacuum tube to maintain the bias voltage of an output stage uniform, obtaining stable output power characteristic.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE INVENTION

Reference will now be made in detail to the preferred embodiments of the present invention, examples of which are illustrated in the accompanying drawings.

Figure 1:
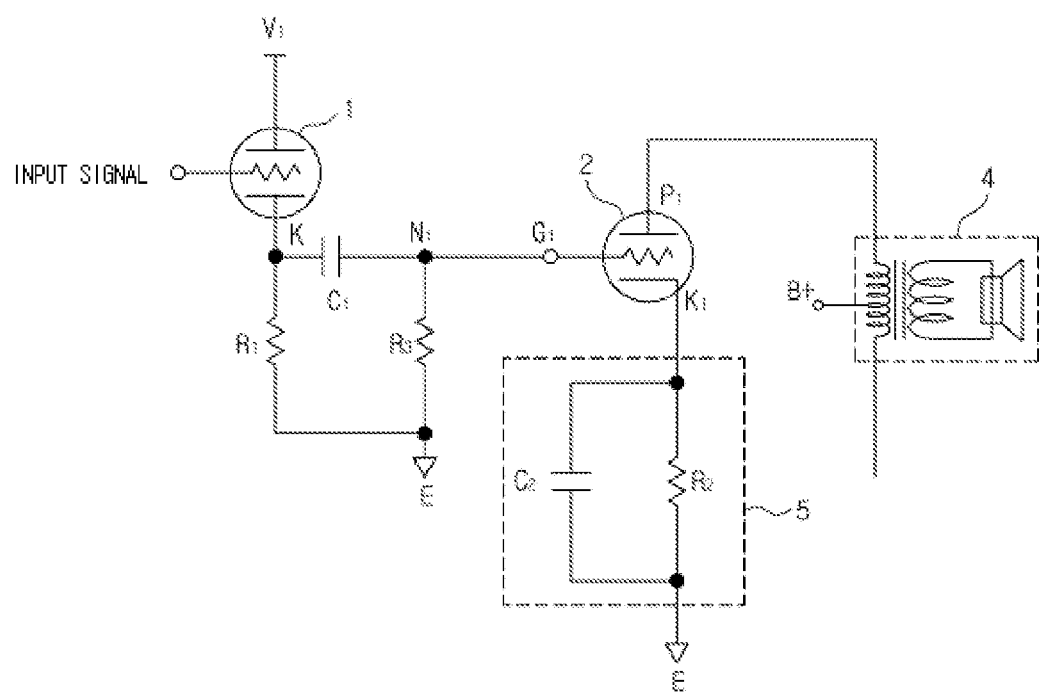
FIG. 1 is a circuit diagram of an output circuit of a conventional vacuum-tube amplifier.
Figure 2:
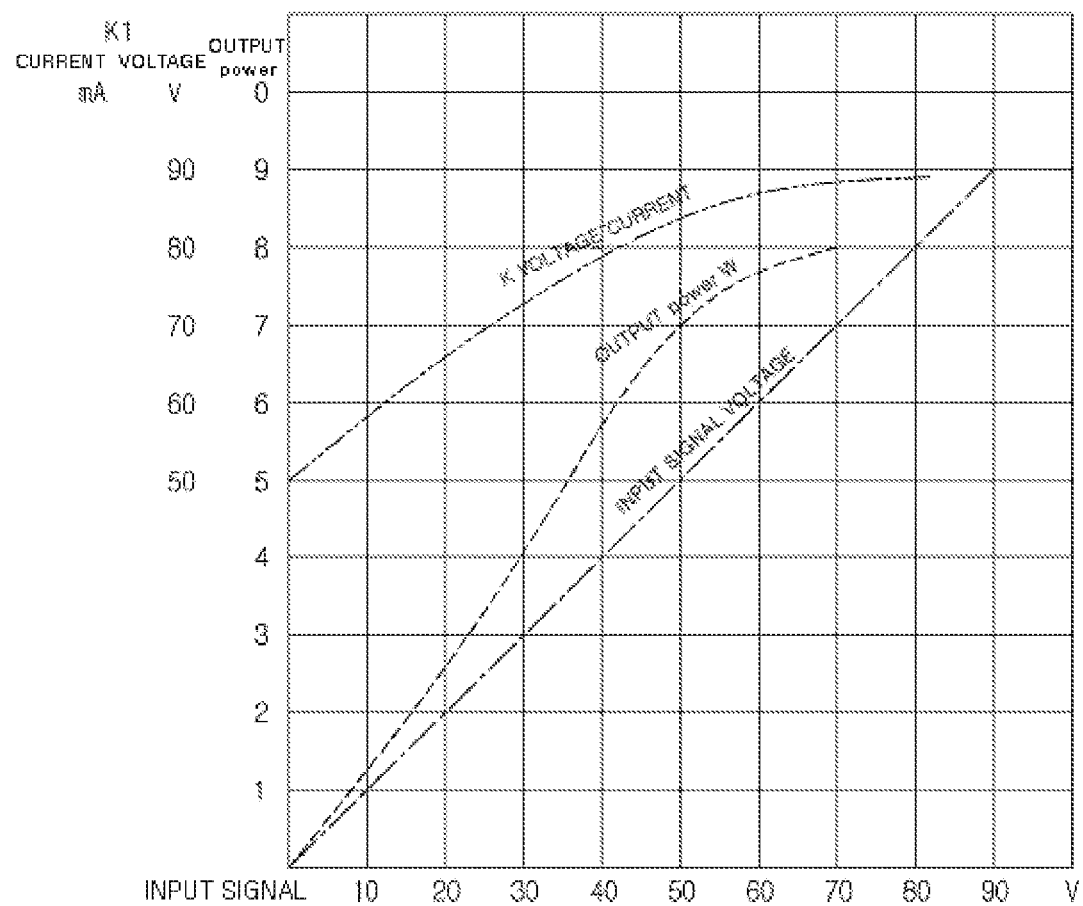
FIG. 2 illustrates the relationship between an input signal and an output power of a conventional vacuum-tube amplifier.
Figure 3:
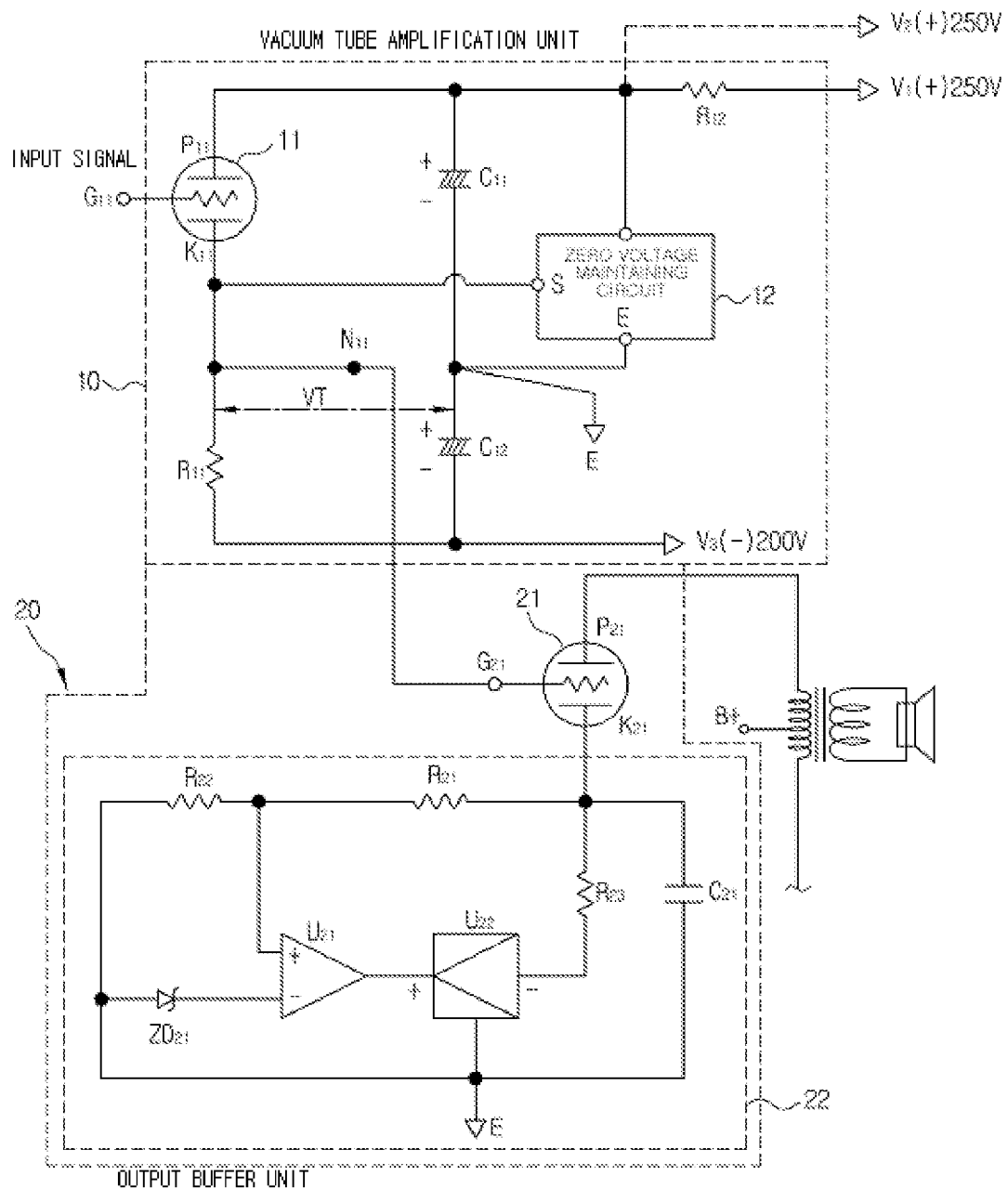
FIG. 3 is a circuit diagram of an output circuit of a vacuum-tube amplifier according to the present invention.

FIG. 3 is a circuit diagram of an output circuit of a vacuum-tube amplifier according to the present invention.

Referring to FIG. 3, the output circuit of the vacuum-tube amplifier according to the present invention includes a front end amplification unit 10 for amplifying an input signal using a vacuum tube 11 and an output amplification unit 20 for power-amplifying the output signal of the front end amplification unit 10 using a vacuum tube 21 and outputting the amplified signal.

The output circuit of the vacuum-tube amplifier further includes a zero voltage-maintaining circuit 12 for controlling a voltage applied to a plate P11 of the vacuum tube 11 based on the voltage of a cathode K11 of the vacuum tube 11 of the front end amplification unit 10 to maintain the DC voltage of the cathode K11 as 0V, and a variable self-bias circuit 22 for maintaining a bias voltage of a cathode K21 of the vacuum tube 21 of the output amplification unit 20 uniform using a self maintaining circuit irrespective of a variation in the input signal.

The front end amplification unit 10 receives the input signal through a grid G11 of the vacuum tube 11 and applies a voltage V1(+) to the plate P11 of the vacuum tube 11 through a resistor R12. A voltage V3(−) is applied to the cathode K11 of the vacuum tube 11 through a resistor R11. The zero voltage-maintaining circuit 12 is connected between the cathode K11 and the plate P11 of the vacuum tube 11.

The zero voltage-maintaining circuit 12 detects the voltage of the cathode K11 of the vacuum tube 11, divides the voltage V1(+) applied to the plate P11 of the vacuum tube 11 and controls the voltage applied to the plate P11. The zero voltage-maintaining circuit 12 connects/short-circuits a resistor R17 for dividing the voltage V1(+) applied to the plate P11 of the vacuum tube 11. The zero voltage-maintaining circuit 12 maintains the DC voltage of the cathode K11 of the vacuum tube 11 as 0V by repeating connection/short-circuiting of the voltage-dividing resistor R17 in response to a predetermined time constant.

A first smoothing condenser C11 is connected between the plate P11 of the vacuum tube 11 and a ground terminal E and a second smoothing condenser C12 is connected between the ground terminal E and a voltage V3(−) input terminal to smooth a ripple voltage.

Figure 4:
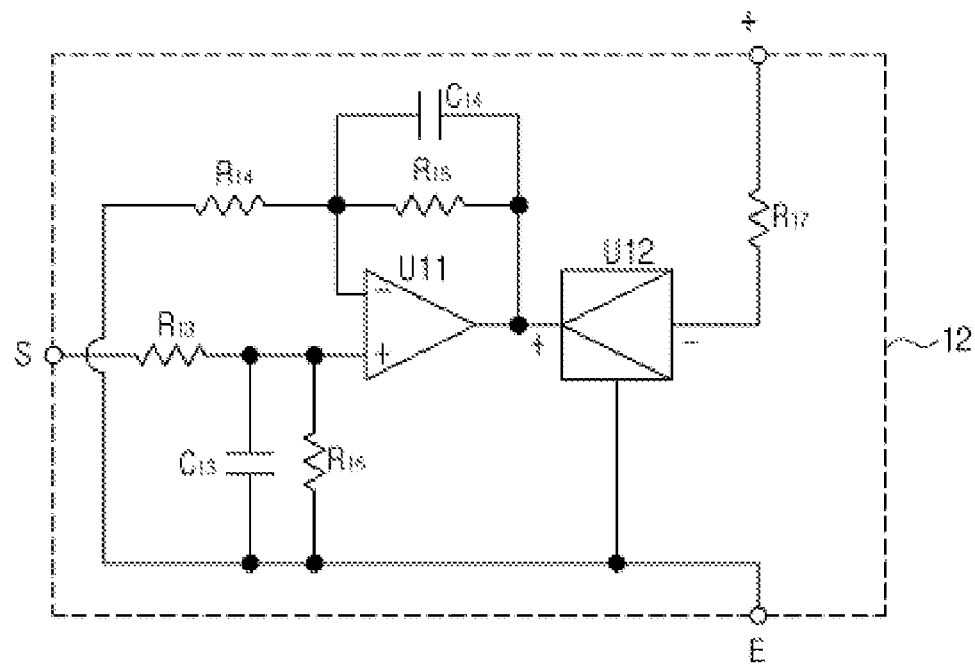
FIG. 4 is a circuit diagram of a zero voltage-maintaining circuit of the vacuum-tube amplifier according to the present invention.

FIG. 4 is a circuit diagram of the zero voltage-maintaining circuit 12. Referring to FIG. 4, the plate P11 of the vacuum tube 11 is connected to an output terminal (−) of a power amplifier U12 of the zero voltage-maintaining circuit 12 through the resistor R17. The cathode K11 of the vacuum tube 11 is connected to a non-inverted input terminal (+) of a differential amplifier U11 at a reference voltage according to voltage-dividing resistors R13 and R16 and a time-constant condenser C13. A self output of the differential amplifier U11 is applied to an inverted input terminal (−) of the differential amplifier U11 through voltage-dividing resistors R15 and R14 and a time-constant condenser C14. That is, the zero voltage-maintaining circuit 12 divides the voltage of the plate P11 of the vacuum tube 11 by the resistors R12 and R17 based on the voltage of the cathode K11 of the vacuum tube 11 and controls the voltage of the plate P11. Accordingly, the zero voltage-maintaining circuit 12 maintains the voltage between the cathode K11 and the ground terminal E as 0V.

Referring to FIG. 3, the variable self-bias circuit 22 of the vacuum-tube amplifier according to the present invention connects a grid G21 of the vacuum tube 21 to an output node N11 of the front end amplification unit 10 to receive the input signal and amplifies the input signal through a plate P21 of the vacuum tube 21. The variable self-bias circuit 22 includes a differential amplifier U21 having a non-inverted input terminal (+) receiving the output voltage of a cathode K21 of the vacuum tube 21, which is divided by two resistors R21 and R22, and an inverted input port (−) receiving a reference voltage set by a zener diode ZD21, a power amplifier U22 having an input terminal (+) receiving the output of the differential amplifier U21 and an output terminal (−) receiving the output of the cathode K21 of the vacuum tube 21 through a bias resistor R23, and a smoothing condenser C21 connected between the cathode K21 of the vacuum tube 21 and the ground terminal E to smooth a peak value.

The zero voltage-maintaining circuit 12 is included in the front end amplification unit 10 and the variable self-bias circuit 22 is included in the output amplification unit 20.

Though the conventional vacuum-tube amplifier must use a coupling condenser in order to output an amplified AC signal, the vacuum-tube amplifier of the present invention can output an AC signal without using a AC coupling element by maintaining the voltage of the cathode K11 of the vacuum tube 11 of the front end amplification unit 100 as 0V.

The operation of the vacuum-tube amplifier according to the present invention is explained with reference to FIGS. 3 and 4. Referring to FIG. 3, a voltage V1 of +250V is applied to the plate P11 of the vacuum tube 11 through the resistor 12 and a voltage V3 of −200V is applied to the cathode K11 of the vacuum tube 11, for example. If a zero voltage method is not used, the voltage VT of the cathode K11 of the vacuum tube 11 becomes 50V. However, the zero voltage-maintaining circuit 12 is operated such that the voltage of +250V applied to the plate P11 is divided by the resistor R12 and the voltage-dividing resistor R17 included in the zero voltage-maintaining circuit 12 to apply a voltage of +200V to the cathode K11. Accordingly, the voltage of the cathode K11 of the vacuum tube 11 becomes 0V. It is impossible to continuously maintain 0V due to errors in the vacuum tube and other components. To stably maintain 0V, the present invention constructs the zero voltage-maintaining circuit 12.

In the zero voltage-maintaining circuit 12, the voltage detected from the cathode K11 of the vacuum tube 11 is divided by the resistors R13 and R16 and applied to the non-inverted input terminal (+) of the differential amplifier U11. Here, when the output signal of the differential amplifier U11 is at a high level, the input terminal (−) of the power amplifier U12 becomes a low level and the resistor R17 functions as a voltage-dividing resistor. That is, the voltage V1 of +250V is divided by the resistors R12 and R17 and applied to the plate P11 of the vacuum tube 11.

When the output signal of the differential amplifier U11 becomes a high level, the high-level signal is divided by the resistors R15 and R14, and thus a voltage higher than the voltage of the non-inverted input terminal (+) of the differential amplifier U11 is applied to the inverted input terminal (−) of the differential amplifier U11. Here, the divided voltage is delayed by the time-constant condenser C14 and applied to the inverted input terminal (−) and the output signal of the differential amplifier U11 is transited from a high level to a low level.

When the output signal of the differential amplifier U11 becomes a low level, the input terminal (+) of the power amplifier U12 becomes a low level and the output terminal (−) of the power amplifier U12 becomes a high level so that the resistor R17 is short-circuited. Accordingly, the voltage V1 of +250V is applied to the plate P11 of the vacuum tube 11 through the resistor R12.

The output signal of the differential amplifier U11 is transited and connection/short-circuiting of the resistor R17 is repeated to control the voltage of the plate P11 and the aforementioned operation is repeated. A time interval of repeating the operation is controlled by the time constant of the differential amplifier U11 and a ripple voltage applied to the plate P11 and the cathode K11 is smoothed by the smoothing condensers C11 and C12.

Consequently, the voltage of the plate P11 of the vacuum tube 11 is controlled by the zero voltage-maintaining circuit 12 to stably maintain the voltage between the cathode K11 of the vacuum tube 11 and the ground terminal E as 0V.

Since the voltage of the cathode K11 of the vacuum tube 11 of the front end amplification unit 11 is maintained as 0V, only AC signals can be output even when a coupling condenser or a transformer is not used at the output node N11.

When the front end amplification unit 10 transmits an amplified AC signal through the output node N11 without using a coupling element, the output amplification unit 20 maintains the bias voltage of the cathode K21 of the vacuum tube 21 to increase output power and improve distortion.

In the self-bias circuit 22 of the vacuum-tube amplifier according to the present invention, the voltage of the cathode K21 of the vacuum tube 21 is divided by resistors R21 and R22 and input to the non-inverted input terminal (+) of the differential amplifier U21. Here, the differential amplifier U21 compares the reference voltage set by the zener diode ZD21 to the voltage divided by the resistors R21 and R22. When the voltage of the non-inverted input terminal (+) is higher than the reference voltage, the output signal of the differential amplifier U21 becomes a high level. Here, the voltage of the input terminal (+) of the power amplifier U22 is at a high level so that the resistor R23 functions as a load of the cathode K21 of the vacuum tube 21 according to the operation of the power amplifier U22.

Since the resistor R23 serves as a load, the voltage of the non-inverted input terminal (+) of the differential amplifier U21 is decreased and the output signal of the differential amplifier U21 becomes a low level. Then, the power amplifier U22 performs an inverting operation so that the resistor R23 is short-circuited. The voltage obtained by dividing the voltage of the cathode K21 of the vacuum tube 21 by the resistors R21 and R22 is applied to the non-inverted input terminal (+) of the differential amplifier U21, and thus the output signal of the differential amplifier U21 becomes a high level. Accordingly, the resistor R22 23 is operated as a load of the cathode K21 of the vacuum tube 21 according to the power amplifier U22.

When the aforementioned operation is continuously repeated, the voltage of the cathode K21 of the vacuum tube 21 is fixed by a voltage value set by the resistors R21 and R22. That is, the resistor R23 functions as a load and short-circuits repeatedly according to the operations of the differential amplifier R21 and the power amplifier U22 and a peak value is smoothed by the smoothing condenser C21. Accordingly, the bias voltage of the cathode K21 of the vacuum tube 21 is fixed and does not affect the output power in response to the input signal.

Therefore, the bias voltage of the cathode K21 of the vacuum tube 21 is not varied by a value set by the resistors R21 and R22 even when a basic current of the vacuum tube 21 is 50 mA through 100 mA, for example.

Figure 5:
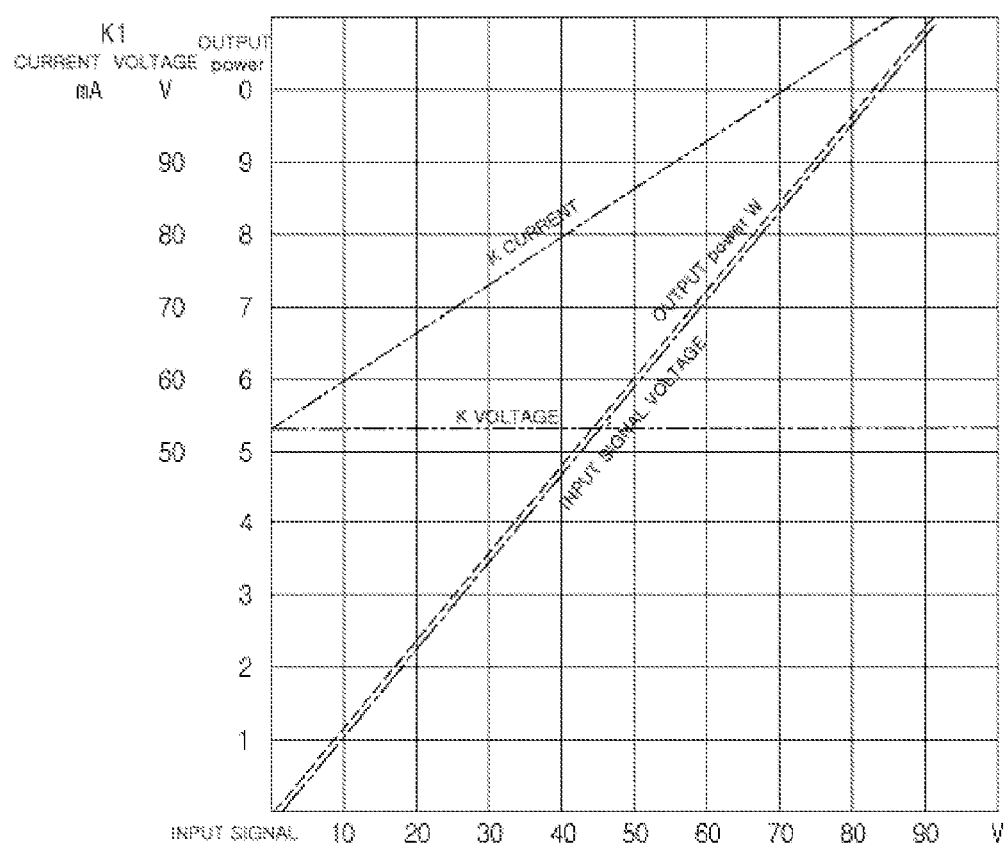
FIG. 5 illustrates the relationship between an input signal and an output power of a variable self-bias circuit of the vacuum-tube amplifier according to the present invention.

Referring to FIG. 5, when the input voltage of the grid G21 of the vacuum tube 21 is increased, the current of the cathode K21 of the vacuum tube 21 is increased in proportion to the input voltage of the grid G21. Here, when a variable operation of the cathode K21 is performed by the resistors R21 and R22, the voltage of the cathode K21 is not varied but fixed in a set range. Thus, the increase in the input signal of the grid G21 is not affected by the cathode K21, the output power W obtains satisfactory linearity in proportion to the increase in the input signal, the output power W is increased by 25% and distortion is improved up to a set limit.

As described above, the vacuum-tube amplifier according to the present invention can transmit AC signals without using an AC coupling element by maintaining the voltage of the cathode of the vacuum tube of the front end amplification unit as 0V. Furthermore, the vacuum-tube amplifier according to the present invention automatically maintains the self-bias of the cathode of the vacuum tube of the output amplification unit to a fixed value to obtain output power that is not affected by the cathode and is proportional to an input signal. Moreover, the output power is increased and distortion is improved according to satisfactory linearity of the output power.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. An output circuit of a vacuum-tube amplifier comprising:
    a front end amplification unit for amplifying an input signal using a first vacuum tube;
    an output amplification unit for power-amplifying the output signal of the front end amplification unit using a second vacuum tube and outputting the amplified signal to the outside;
    a zero voltage-maintaining circuit for controlling a voltage applied to a plate of the first vacuum tube in response to the voltage of a cathode of the first vacuum tube to maintain the DC voltage of the cathode of the first vacuum tube as 0V; and
    a variable self-bias circuit for maintaining a bias voltage of a cathode of the second vacuum tube uniform irrespective of a variation in the input signal.

2. The output circuit of a vacuum-tube amplifier of claim 1, wherein the front end amplification unit comprises:
    the first vacuum tube having a grid connected to a signal input port and a cathode connected to an output node;
    a resistor for applying a negative voltage to the cathode of the first vacuum tube;
    a resistor for applying a positive voltage to the plate of the first vacuum tube;
    the zero voltage-maintaining circuit for continuously controlling connection/short-circuiting of a resistor for dividing the positive voltage with the resistor in response to a predetermined time constant based on the voltage of the cathode of the first vacuum tube and maintaining the DC voltage of the cathode of the first vacuum tube as 0V according to the control of the positive voltage; and
    a first smoothing condenser connected between the plate of the first vacuum tube and a ground terminal and a second smoothing condenser connected between the ground terminal and the terminal of the negative voltage.

3. The output circuit of a vacuum-tube amplifier of claim 2, wherein the zero voltage-maintaining circuit comprises:
    the voltage-dividing resistor connected to the plate of the first vacuum tube;
    a power amplifier connected to the output terminal (−) of the voltage-dividing resistor; and
    a differential amplifier having a non-inverted input terminal (+) receiving the voltage of the cathode of the first vacuum tube through voltage-dividing resistors and a time constant condenser, and an inverted input terminal receiving the voltage of an output terminal of the differential amplifier through voltage-dividing resistors and a time constant condenser, the output terminal of the differential amplifier being connected to an output terminal (+) of the power amplifier.

4. The output circuit of a vacuum-tube amplifier of claim 1, wherein the variable self-bias circuit of the output amplification unit comprises:
    a differential amplifier having a non-inverted input terminal (+) receiving the output voltage of the cathode of the second vacuum tube, which is divided by two resistors, and an inverted input terminal (−) receiving a reference voltage set by a zener diode;
    a power amplifier having an input terminal (+) connected to the an output terminal of the differential amplifier and an output terminal (−) connected to the cathode of the second vacuum tube through a resistor; and
    a smoothing condenser connected between the cathode of the second vacuum tube and the ground terminal to smooth a peak value.

* * * * *